US012660382B2

(12) United States Patent     (10) Patent No.:   US 12,660,382 B2

Zhou et al.     (45) Date of Patent:    Jun. 16, 2026

(54) COVER PLATE, MANUFACTURING METHOD THEREOF AND DISPLAY PANEL

(71) Applicant: Shenzhen China Star Optoelectronics Semiconductor Display Technology Co., Ltd., Shenzhen (CN)

(72) Inventors: Mingjun Zhou, Shenzhen (CN); Guofu Tang, Shenzhen (CN); Pangling Zhang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 387 days.

(21) Appl. No.: 18/520,770

(22) Filed: Nov. 28, 2023

(65) Prior Publication Data

US 2024/0213414 A1     Jun. 27, 2024

(30) Foreign Application Priority Data

Dec. 27, 2022    (CN) .......................... 202211689216.4

(51) Int. Cl.
   *H10H 20/84*      (2025.01)
   *H10H 20/01*      (2025.01)

(52) U.S. Cl.
   CPC ........... *H10H 20/84* (2025.01); *H10H 20/034* (2025.01)

(58) Field of Classification Search
   CPC ............................ H10H 20/84; H10H 20/034
   USPC .......................................................... 257/79
   See application file for complete search history.

(56) References Cited

U.S. PATENT DOCUMENTS

| | | | |
|---|---|---|---|
| 11,641,762 B2 * | 5/2023 | Wang ..................... | H10K 71/00 |
| | | | 257/40 |
| 2013/0306946 A1 * | 11/2013 | Chang ................... | H10K 59/40 |
| | | | 257/40 |
| 2021/0200365 A1 * | 7/2021 | Lee ........................ | H10K 59/40 |

FOREIGN PATENT DOCUMENTS

| | | |
|---|---|---|
| CN | 111312797 | 6/2020 |
| CN | 111403466 | 7/2020 |
| CN | 111864105 | 10/2020 |
| CN | 113066830 | 7/2021 |
| CN | 113629206 | 11/2021 |

OTHER PUBLICATIONS

Notification of Office Action and Search Report Dated May 31, 2024 From The State Intellectual Property Office of the People's Republic of China Re. Application No. 202211689216.4 and Its Translation Into English. (15 Pages).

* cited by examiner

*Primary Examiner* — Michael G Lee

(57)          ABSTRACT

A cover plate, a manufacturing method of the cover plate, and a display panel are provided. The cover plate covers the display panel and includes a cover plate body and an anti-reflection layer. The anti-reflection layer is provided with anti-reflection particles therein, and an orthographic projection of the anti-reflection particles in the display panel is completely located in a region of each sub-pixel unit. By accurately controlling the distribution position of the particles during the manufacturing process, each particle can completely fall in the corresponding region of each sub-pixel unit, and will not be distributed at a junction position between two adjacent sub-pixel units.

16 Claims, 3 Drawing Sheets

COVER PLATE, MANUFACTURING METHOD THEREOF AND DISPLAY PANEL

CROSS-REFERENCE TO RELATED APPLICATION

This application claims the benefit of priority of China Patent Application No. 202211689216.4, filed on Dec. 27, 2022, the contents of which are incorporated by reference as if fully set forth herein in their entirety.

TECHNICAL FIELD

The present disclosure relates to a field of display panel design and manufacturing technologies, and in particular, to cover plates, manufacturing methods thereof, and display panels.

DESCRIPTION OF RELATED ART

With the continuous development of display panel manufacturing technology, people put forward higher requirements for various performances of display panels and devices.

In the related art, when preparing and forming a display panel, after respective functional film layers in the display panel are prepared and before a usable finished product is obtained, a protective cover plate layer needs to be disposed on the display panel to protect respective functional layers in the display panel, and especially for the widely used touch display panel nowadays, other film layers can be effectively prevented from being scratched during touch operation by setting the protective cover plate. In the related art, when the protective cover layer is prepared, an atomization film (also referred to as polymer dispersed liquid crystal, PDLC) is usually prepared on the cover layer through an atomization process, and particles are arranged in the atomization film, so that the problem of total reflection of light is resisted by the particles, and the display effect is improved. However, in the related art, when the particles in the atomization film are prepared, the distribution of the particles cannot be accurately controlled, and the manufacturing process is unsatisfactory, so that the particles span two sub-pixel units or multiple sub-pixel units simultaneously. Thus, when the cover plate is combined with the display panel, the particles disposed between adjacent sub-pixels will result in mixed light scattering between sub-pixels of different colors, which will result in the observation of color star dots by observers, thereby reducing the display effect of the display panel and being not conducive to the further improvement of the comprehensive performance of the display panel.

To sum up, after the cover plate prepared in the related art is laminated with the display panel, the particles disposed between adjacent sub-pixels will cause the problem of mixed light scattering between sub-pixels of different colors, which will result in the problem of star dots, and reduce display effect and comprehensive performance of the panel.

SUMMARY OF THE INVENTION

Embodiments of the present disclosure provides a cover plate, a manufacturing method of the cover plate, and a display panel. In order to effectively improve the existing manufacturing process, the distribution position of particles in the cover plate is inaccurate, which further leads to the problem of star dots when the display panel is displayed.

In order to solve the above technical problems, in a first aspect, the present disclosure provides a cover plate for covering a display panel, the display panel includes multiple sub-pixel units, and the cover plate includes:

a cover plate body; and an anti-reflection layer, disposed on a surface of a side of the cover plate body;

the anti-reflection layer is provided with anti-reflection particles therein, and an orthographic projection of the anti-reflection particles in the display panel is located in an area of each of the multiple sub-pixel units.

According to an embodiment of the present disclosure, a particle size of each of the anti-reflection particles is smaller than a width of each of the multiple sub-pixel units.

According to an embodiment of the present disclosure, each of the multiple sub-pixel units is provided with one or more anti-reflection particles therein.

According to an embodiment of the present disclosure, a distribution density of the anti-reflection particles varies among different sub-pixel units.

Accord to an embodiment of that present disclosure, the distribution density of the anti-reflection particles close to an edge region of the display panel is greater than the distribution density of the anti-reflection particles corresponding to a center position of the display panel.

According to an embodiment of the present disclosure, a gap is defined between every two adjacent anti-reflection particles in a same sub-pixel unit.

According to an embodiment of the present disclosure, a material of the anti-reflection particles includes any one of silicon carbide, silicon nitride, or silicon dioxide.

In a second aspect, an embodiment of the present disclosure provides a display panel, which includes the cover plate provided in the embodiment of the present disclosure.

In a third aspect, an embodiment of the present disclosure provides a manufacturing method of a cover plate, which includes the following steps:

providing a cover plate body;

placing a positioning screen on the cover plate body, where the positioning screen includes multiple openings, the multiple openings are arranged respectively corresponding to multiple sub-pixel units in a display panel, and an orthographic projection of the positioning screen projected on the display panel coincides with boundaries between every two adjacent sub-pixel units of the multiple sub-pixel units; and spraying anti-reflection particles into each of the multiple openings of the positioning screen to form an anti-reflection layer and obtain the cover plate.

According to an embodiment of the present disclosure, the step of placing the positioning screen on the cover plate body further includes the following steps:

placing multiple stop blocks at peripheral edge positions of the cover plate body, and then placing the positioning screen on the multiple stop blocks.

Compared with the related art, the embodiments of the present disclosure provide the cover plate, the manufacturing method for the cover plate, and the display panel. The cover plate is used to cover the display panel, and includes the cover plate body and the anti-reflection layer. The anti-reflection particles are arranged in the anti-reflection layer, and the orthographic projection of the anti-reflection particles in the display panel is completely located in an area of each of the multiple sub-pixel units. In the embodiment of the present disclosure, the distribution position of the particles is accurately controlled in the manufacturing process, so that each particle can completely fall in the corresponding area of each sub-pixel unit, and will not be distributed at a junction position between two adjacent sub-pixel units, thereby effectively avoiding the problem of star dots such as color mixing caused by the particles during the light-emitting display of the display panel, and effectively improving the comprehensive performance such as the display effect of the display panel.

BRIEF DESCRIPTION OF THE DRAWINGS

In order to illustrates technical solutions in embodiments or the related art more clearly, the accompanying drawings needed to be used in the description of the embodiments or the related art will be briefly introduced below. Apparently, the accompanying drawings in the following description are only some embodiments of the present disclosure. For those skilled in the art, other drawings can be derived from these drawings without giving creative labor.

DETAILED DESCRIPTION OF SPECIFIC EMBODIMENTS OF THE INVENTION

Figure 1:
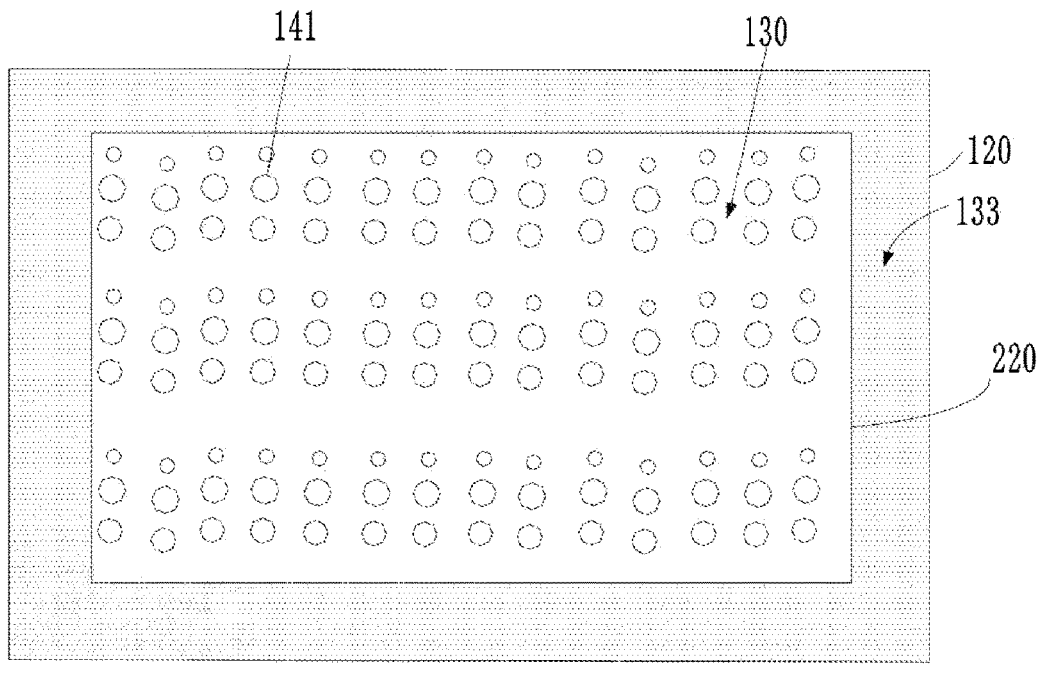
FIG. 1 illustrates a schematic structural view of film layers of a cover plate according to an embodiment of the present disclosure.

The following disclosure provides different embodiments or examples to realize different structures of the present disclosure with reference to the accompanying drawings in the embodiments of the present disclosure. In order to simplify the present disclosure, components and arrangements of specific embodiments are described below. In addition, the examples of various specific processes and materials provided by the present disclosure are applications for which those skilled in the art can realize other processes. All other embodiments obtained by those skilled in the art without creative labor are within the scope of protection of the present disclosure.

In the description of the present disclosure, the terms "center", "longitudinal", "lateral", "length", "width", "thickness", "up", "down", "front", "rear", "left", "right", "vertical", "horizontal", "top", "bottom", "inner", "outer", "clockwise", "counterclockwise", and the like indicate orientation or positional relationships based on those shown in the accompanying drawings, and are intended only to facilitate the description of the present disclosure and to simplify the description, and are not intended to indicate or imply that the devices or elements referred to must have a particular orientation, be constructed and operated in a particular manner, and therefore is not to be construed as a limitation of the present disclosure. In addition, the terms "first" and "second" are only used for descriptive purposes, and cannot be construed as indicating or implying relative importance or as implying the number of technical features indicated.

With the continuous development of display panel manufacturing technology, people put forward higher requirements for various performances of display panels and devices.

The display panel is generally formed by stacking various functional film layers. After the display panel is manufactured, in order to protect the film layers in the display panel, it is usually necessary to attach a protective cover layer on the outermost layer of the display panel, which has a certain thickness and strength. As for a touch display panel, since the touch operation needs to be frequently performed on the surface of the display panel, the protective cover plate can better protect each film layer inside the display panel, thereby preventing the scratch problem during the touch operation. In addition, the protective cover plate also has an anti-reflection function to a certain extent, so as to ensure that the panel has a high display effect.

In the related art, when the protective cover plate is prepared and formed, when anti-reflection particles are added in the cover plate, the anti-reflection particles cannot be accurately arranged, so that the anti-reflection particles are disposed between adjacent pixel units, thereby causing the problems of star dots and color mixing when the display panel is displayed, thereby reducing the display effect of the panel.

Embodiments of the present disclosure provides a cover plate, a display panel, and a manufacturing method for the cover plate, so as to effectively avoid the problems of star dots and color mixing when the display panel is displayed, and improve the display effect and comprehensive performance of the display panel.

As shown in FIG. 1, FIG. 1 illustrates a schematic structural view of film layers of a cover plate according to an embodiment of the present disclosure. The cover plate includes a cover plate body 120 and an anti-reflection layer 220. The anti-reflection layer 220 is disposed on a surface of a side of the cover plate body 120. Specifically, when setting, the anti-reflection layer 220 can be disposed on an inner surface of the cover plate body 120 close to the display panel, or the anti-reflection layer 220 can be disposed on an outer surface of the cover plate body 120, or the anti-reflection layer 220 can be disposed on both the inner and outer surfaces of the cover plate body 120 as required. Specifically, it can be set according to different products, which will not be repeated herein.

In an embodiment of the present disclosure, when the anti-reflection layer 220 is disposed, the anti-reflection layer 220 is at least correspondingly disposed in a display region 130 of the display panel, and an area of the anti-reflection layer 220 is smaller than or equal to that of the cover plate body 120, while the area of the anti-reflection layer 220 is greater than or equal to that of the display region 130 of the corresponding display panel. In some embodiments, the anti-reflection layer 220 has the same area as the display region 130 of the display panel.

In an embodiment, the cover plate further includes a frame region 133 and a display region 130 corresponding to the display panel. In the following embodiment, the frame region 133 is disposed around the display region 130.

In an embodiment of the present disclosure, anti-reflection particles 141 are arranged in the anti-reflection layer 220. The anti-reflection particles 141 can be uniformly distributed in the display region 130 corresponding to the cover plate, or the anti-reflection particles 141 can be randomly distributed in the display region 130 corresponding to the cover plate. Usually, during manufacturing, the anti-reflection particles 141 are coated irregularly, and finally the anti-reflection layer 220 containing the anti-reflection particles 141 is formed. After the above changes are made, it is necessary to attach the cover plate to the surface of the display panel and complete the manufacturing of the panel.

The anti-reflection particles 141 are only distributed in the area of each sub-pixel unit in the display region of the display panel. That is, an orthographic projection of the anti-reflection particles 141 in the display panel is completely located in each sub-pixel unit, and the anti-reflection particles 141 are not disposed on a junction boundary between two adjacent sub-pixel units. In this way, the problems of star dots and color mixing when the display panel is displayed can be effectively reduced.

Figure 2:
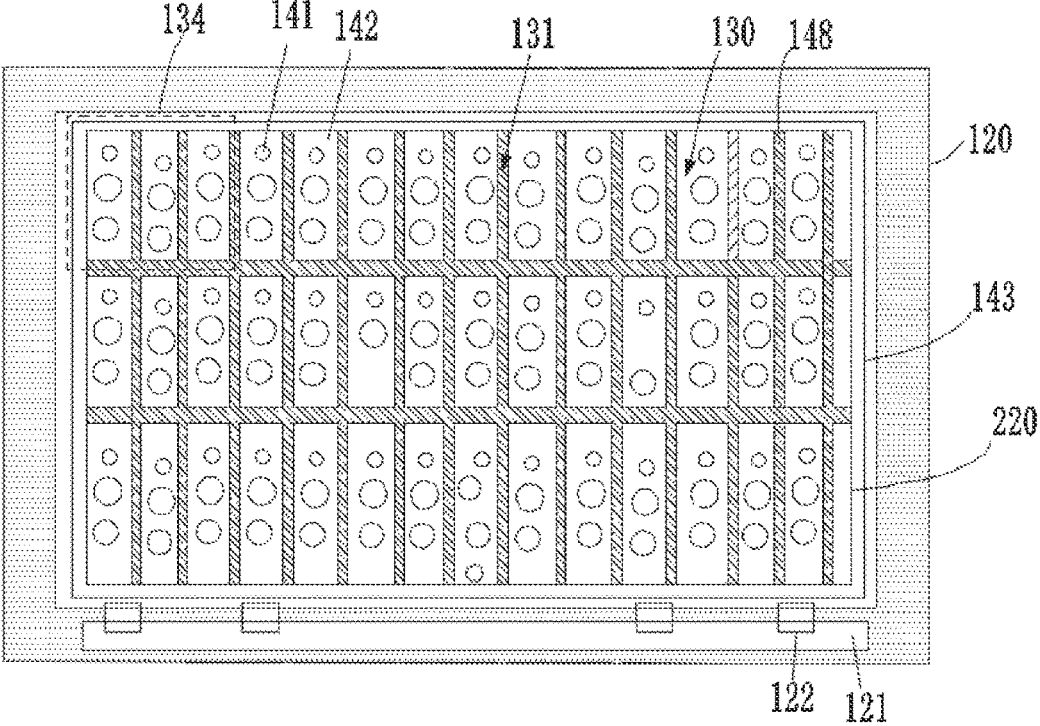
FIG. 2 illustrates a schematic structural view of film layers after a display panel is assembled according to an embodiment of the present disclosure.

As shown in FIG. 2, FIG. 2 illustrates a schematic structural view of film layers after a display panel is assembled according to an embodiment of the present disclosure. Combined with the cover plate structure in FIG. 1, in this embodiment of the present disclosure, the cover plate is attached to the outermost side of the display panel. In this embodiment of the present disclosure, when the anti-reflection particles 141 are arranged, the particle size of each anti-reflection particle 141 can be set to the same size, or the anti-reflection particles 141 can be set to the same material or different materials according to different specifications of products. The anti-reflection particles 141 in the anti-reflection layer may also be set to different particle sizes. It will not be repeated herein.

In this embodiment, the cover plate body 120 and the anti-reflection layer 220 are attached to the display panel 143. The display panel 143 is located below the cover plate. The display region 130 of the cover plate corresponds to the display region 130 of the display panel 143, and the frame region 133 of the cover plate body 120 is a non-display region of the display panel 143. The display region 130 of the display panel 143 includes multiple pixel units 134 (also referred to pixels 134). The multiple pixel units 134 are arranged in the light-emitting region of the display panel, and each pixel unit 134 includes multiple sub-pixel units 142. The multiple sub-pixel units 142 may include sub-pixel units of different colors, such as in the embodiment of the present disclosure, the sub-pixel units 142 include red sub-pixel units, blue sub-pixel units, and green sub-pixel units. The red sub-pixel units, the blue sub-pixel units and the green sub-pixel units are sequentially arranged along the row direction of the pixel units 134, thereby realizing the color display effect of the display panel.

In this situation, a shielding structure 148 is arranged between two adjacent sub-pixel units 142, and the shielding structure 148 separates each sub-pixel unit 142, thus effectively preventing the problem of color mixing between two adjacent pixel units with different colors. The shielding structure 148 includes a shielding region 131. The shielding region 131 is located between two adjacent sub-pixel units 142. In the embodiment of the present disclosure, the shielding structure 148 may be a black matrix layer, and the problem of color mixing is prevented by the black matrix layer.

In an embodiment, the anti-reflection particles 141 in the anti-reflection layer 220 are located in the corresponding area of each sub-pixel unit 142, so that the anti-reflection particles 141 are not distributed at the corresponding position of the shielding region 131, and in this case, there will be no simultaneous spanning of the same antireflective particles 141 across two or more sub-pixel units 142. Thus, the display problems of the display problems of star dots and color mixing of the display panel due to the anti-reflection particles 141 are effectively avoided, and the display effect of the display panel is improved.

In this embodiment of the present disclosure, when the anti-reflection particles 141 are provided, the particle size of the anti-reflection particles 141 is smaller than the width of each sub-pixel unit 142, or the particle size of the anti-reflection particles 141 is smaller than the length and width of each sub-pixel unit 142. In this way, after the cover plate is attached to the display panel, it can be ensured that the anti-reflection particles 141 can be completely located in the corresponding region of each sub-pixel unit 142 and not within the shielding region 131.

In this situation, during the process of coating the anti-reflection particles 141, multiple anti-reflection particles 141 may be disposed in different sub-pixel units 142. However, it is ensured that the anti-reflection particles 141 will not fall into the shielding region 131. Specifically, one or more anti-reflection particles may be disposed in each sub-pixel unit 142. In an embodiment of the present disclosure, the material of the anti-reflection particle 141 may be any one of silicon carbide, silicon nitride, or silicon dioxide. As shown in FIG. 2, one, two or three anti-reflection particles 141 are randomly distributed in different sub-pixel units 142. Therefore, the anti-reflection effect of the display panel is ensured by the anti-reflection particles 141, and the display panel has a high display effect.

In an embodiment of the present disclosure, when the anti-reflection particles in the anti-reflection layer are arranged, the distribution density of the anti-reflection particles may be adjusted as required. Specifically, the anti-reflection particles with different densities are provided within different sub-pixel units 142. For a curved display panel, since the frame of the curved display panel is curved, it is more prone to reflection after the curved surface is curved. Therefore, the distribution density of anti-reflection particles 141 at a position of the display panel close to the frame region can be greater than that in the center of the display region of the display panel. Thus, the anti-reflection effect of the display panel and the comprehensive performance of the display panel can be effectively ensured and improved.

In an embodiment of the present disclosure, in order to avoid the mutual influence between different anti-reflection particles 141 to reduce their anti-reflection effect and the effect of the display panel, a gap is defined between two adjacent anti-reflection particles 141 when the anti-reflection particles 141 are arranged, so that the problem of mutual contact of the anti-reflection particles 141 can be avoided through the gap.

Specifically, the size of the gap between two adjacent anti-reflection particles 141 may be set to be different, or set according to actual needs, which will not be described herein.

In an embodiment, the display panel further includes a chip on film (COF) 122, a circuit board 121 connected to the flip-chip film 122 and other functional components, and finally forms the display panel provided in the embodiment of the present disclosure.

Figure 3:
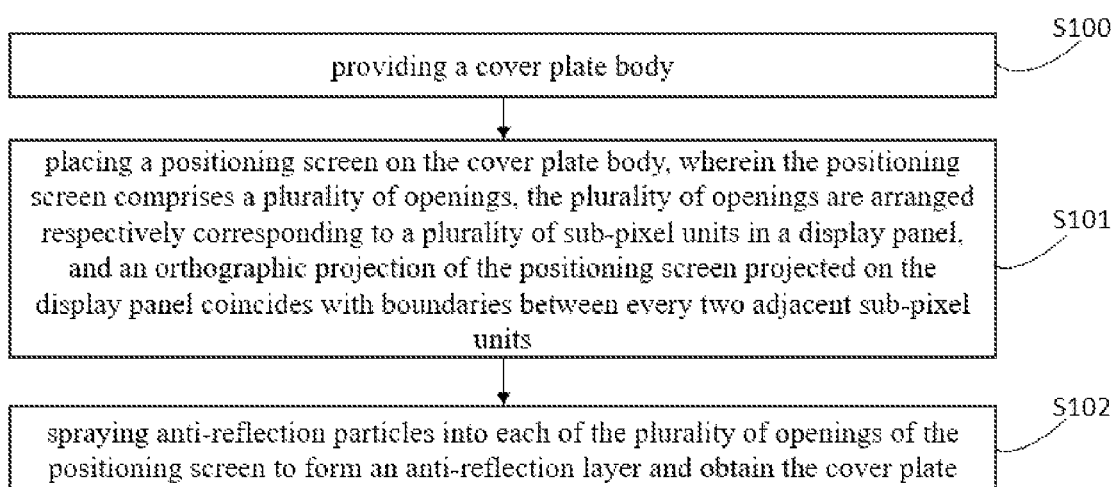
FIG. 3 illustrates a schematic flowchart of a manufacturing process of the cover plate according to an embodiment of the present disclosure.

As shown in FIG. 3, FIG. 3 illustrates a schematic flowchart of a manufacturing process of the cover plate according to an embodiment of the present disclosure. It includes the following steps:

S100: providing a cover plate body;

S101: placing a positioning screen on the cover plate body, where the positioning screen includes multiple openings, and the multiple openings are arranged respectively corresponding to multiple sub-pixel units in a display panel, and an orthographic projection of the positioning screen projected on the display panel coincides with boundaries between every two adjacent sub-pixel units; and S102: spraying anti-reflection particles into each of the multiple openings of the positioning screen to form an anti-reflection layer and obtain the cover plate.

Figure 4:
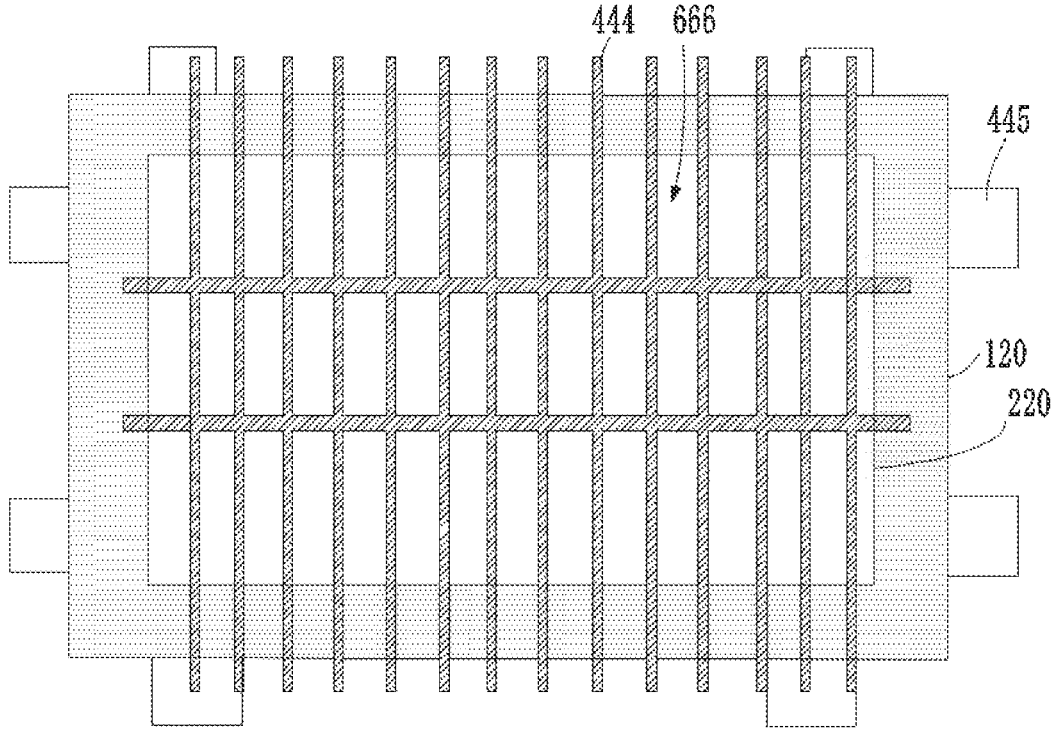
FIGS. 4-5 illustrate schematic structural views of film layers corresponding to the manufacturing process of the cover plate according to the embodiment of the present disclosure.
Figure 5:
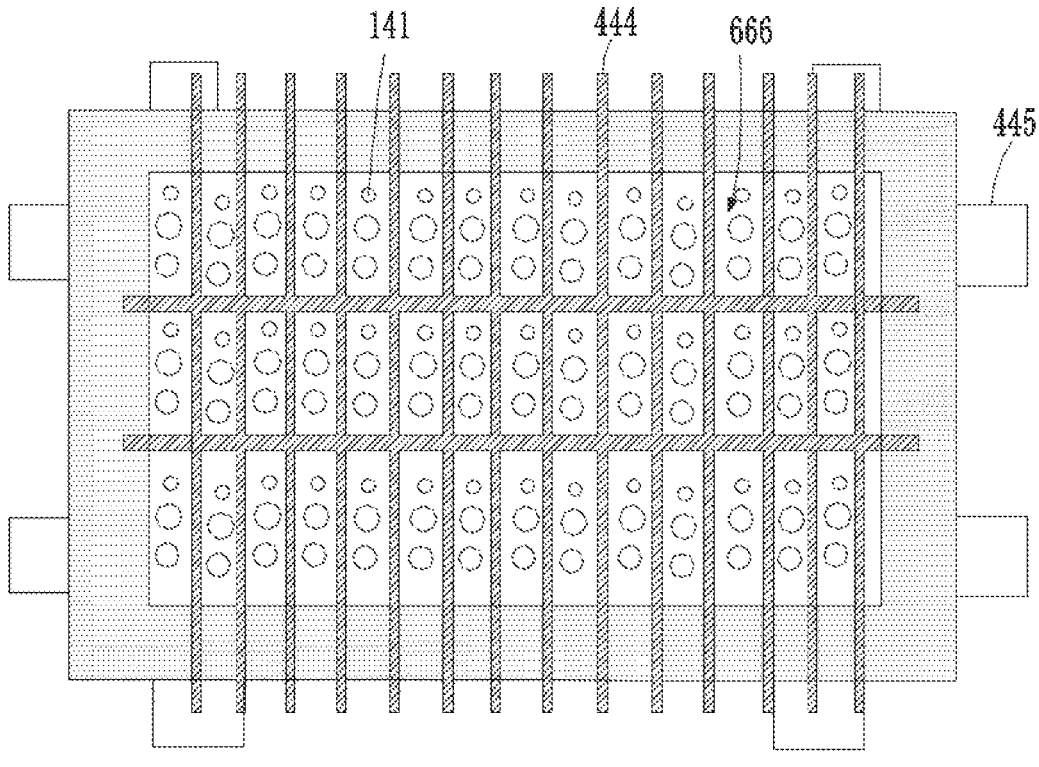

Specifically, as shown in FIG. 4 and FIG. 5, FIGS. 4-5 illustrate schematic structural views of film layers corresponding to the manufacturing process of the cover plate according to the embodiment of the present disclosure. Combined with the structure in FIG. 1 and FIG. 2, in the embodiment of the present disclosure, the cover plate body 120 is first provided to perform an atomization process on the cover plate body. The cover plate body 120 has been subjected to cutting, edge grinding, and ink printing processing.

After the cover plate body 120 is placed and fixed, multiple stop blocks 445 are placed around the cover plate body 120. On the one hand, the stop blocks 445 can play a supporting role, and on the other hand, the stop blocks 445 can also play a certain positioning role.

After setting the stop blocks 445 and the cover plate body 120, the positioning screen 444 is placed on the cover plate body 120. When placing the positioning screen 444, the positioning screen 444 may be placed on the stop blocks 445 and fixed.

In this embodiment, the positioning screen 444 is set according to the type and specification of the corresponding display panel. Specifically, the positioning screen 444 multiple openings 666. Each opening 666 is provided corresponding to each sub-pixel unit of the corresponding display panel. That is, when the positioning screen 444 is opposite to the display panel, each opening 666 fits into each sub-pixel unit. Therefore, in the embodiment of the present disclosure, the frame width of the opening 666 of the positioning screen 444 is the same as the width of the black matrix layer between two adjacent sub-pixel units in the corresponding display panel, so as to ensure that the two can be better matched.

In an embodiment, after the positioning screen 444 and the cover plate body 120 are set, spraying of anti-reflection particles is performed. Specifically, the anti-reflection particles 141 are sprayed into each opening 666 of the positioning screen 444, so that the anti-reflection particles 141 can be uniformly distributed in the entire positioning screen 444 during spraying. That is, in each opening 666, the number and density of anti-reflection particles 141 are the same, thus ensuring that the cover plate has a more consistent anti-reflection effect. Alternatively, the anti-reflection particles 141 may be randomly sprayed according to actual needs. However, it is ensured that at least one anti-reflection particle 141 is distributed in each opening 666 after spraying. Alternatively, according to requirements, in different regions, the anti-reflection particles 141 in the corresponding openings 666 are set to different density distributions, which will not be described in detail herein.

After the anti-reflection particles are sprayed, they are allowed to stand for a period of time until the anti-reflection particles 141 and other materials are stabilized and completely cured to form a film, an anti-reflection layer attached to the surface of the cover plate body 120 and a complete cover plate are obtained.

At this time, the positioning screen 444 is removed and the cover plate is attached to the outer layer of the display panel.

In the embodiment of the present disclosure, since the opening structure of the positioning screen 444 is set corresponding to the sub-pixel units in the display panel, after spraying, the sprayed anti-reflection particles 141 are completely located in the openings. When the cover plate is attached to the display panel, the anti-reflection particles 141 can still be ensured to be located in the corresponding area of each sub-pixel unit. When the display panel normally emits light, since the anti-reflection particles 141 are only located in the corresponding area above each sub-pixel unit, and no anti-reflection particles 141 are located in the area between two adjacent sub-pixel units, the anti-reflection particles will not cause the problem of color mixing between two adjacent sub-pixel units. In this situation, the display effect and comprehensive performance of the display panel can be effectively improved.

An embodiment of the present disclosure also provides a display device, which includes the cover plate prepared in the embodiment of the present disclosure, and the anti-reflection particles arranged in the cover plate have a high anti-reflection effect. Moreover, the problems of star spots and display color mixing on the display panel cannot be caused.

In the embodiment of the present disclosure, the cover plate, the corresponding display panel and display device may be any product or component with display function or touch control function, such as a mobile phone, a computer, an electronic paper and a display, and the specific type thereof is not specifically limited.

In summary, the cover plate, the manufacturing method and the display panel provided by the embodiments of the present disclosure are described in detail. In this paper, the principle and implementation of the present disclosure are illustrated by using specific embodiments. The description of the above embodiments is only used to assist in understanding the technical solutions and core ideas of the present disclosure. Although the present disclosure is disclosed in terms of the illustrated embodiments, the above illustrated embodiments are not intended to limit the present disclosure, and those skilled in the art can make various changes and modifications without departing from the spirit and scope of the present disclosure, so that the scope of protection of the present disclosure is based on the scope defined by the claims.

What is claimed is:

1. A cover plate, for covering a display panel comprising a plurality of sub-pixel units, the cover plate comprising:
   a cover plate body; and,
   an anti-reflection layer, disposed on a surface of a side of the cover plate body;
   wherein the anti-reflection layer is provided with anti-reflection particles therein, and an orthographic projection of the anti-reflection particles in the display panel is located in an area of each of the plurality of sub-pixel units.

2. The cover plate according to claim 1, wherein a particle size of each of the anti-reflection particles is smaller than a width of each of the plurality of sub-pixel units.

3. The cover plate according to claim 2, wherein each of the plurality of sub-pixel units is provided with one or more anti-reflection particles.

4. The cover plate according to claim 1, wherein a distribution density of the anti-reflection particles varies among different sub-pixel units.

5. The cover plate according to claim 4, wherein the distribution density of the anti-reflection particles close to an edge region of the display panel is greater than the distribution density of the anti-reflection particles corresponding to a center position of the display panel.

6. The cover plate according to claim 1, wherein a gap is defined between every two adjacent anti-reflection particles in a same sub-pixel unit.

7. The cover plate according to claim 1, wherein a material of the anti-reflection particles comprises any one of silicon carbide, silicon nitride, or silicon dioxide.

8. A display panel, comprising a cover plate for covering the display panel comprising a plurality of sub-pixel units, the cover plate comprising:

a cover plate body; and, an anti-reflection layer, disposed on a surface of a side of the cover plate body;

wherein the anti-reflection layer is provided with anti-reflection particles therein, and an orthographic projection of the anti-reflection particles in the display panel is located in an area of each of the plurality of sub-pixel units.

9. The cover plate according to claim 8, wherein a particle size of each of the anti-reflection particles is smaller than a width of each of the plurality of sub-pixel units.

10. The cover plate according to claim 9, wherein each of the plurality of sub-pixel units is provided with one or more anti-reflection particles.

11. The cover plate according to claim 8, wherein a distribution density of the anti-reflection particles varies among different sub-pixel units.

12. The cover plate according to claim 11, wherein the distribution density of the anti-reflection particles close to an edge region of the display panel is greater than the distribution density of the anti-reflection particles corresponding to a center position of the display panel.

13. The cover plate according to claim 8, wherein a gap is defined between every two adjacent anti-reflection particles in a same sub-pixel unit.

14. The cover plate according to claim 8, wherein a material of the anti-reflection particles comprises any one of silicon carbide, silicon nitride, or silicon dioxide.

15. A manufacturing method of a cover plate, comprising following steps:

providing a cover plate body;

placing a positioning screen on the cover plate body, wherein the positioning screen comprises a plurality of openings, the plurality of openings are arranged respectively corresponding to a plurality of sub-pixel units in a display panel, and an orthographic projection of the positioning screen projected on the display panel coincides with boundaries between every two adjacent sub-pixel units; and spraying anti-reflection particles into each of the plurality of openings of the positioning screen to form an anti-reflection layer and obtain the cover plate.

16. The manufacturing method of the cover plate according to claim 15, wherein the step of placing the positioning screen on the cover plate body further comprises:

placing a plurality of stop blocks at peripheral edge positions of the cover plate body, and then placing the positioning screen on the plurality of stop blocks.

* * * * *